United States Patent
Lee et al.

(10) Patent No.: US 7,940,589 B2
(45) Date of Patent: May 10, 2011

(54) BIT LINE SENSE AMPLIFIER OF SEMICONDUCTOR MEMORY DEVICE AND CONTROL METHOD THEREOF

(75) Inventors: Ji-Hun Lee, Seoul (KR); Jong-Hyoung Lim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 376 days.

(21) Appl. No.: 12/166,525

(22) Filed: Jul. 2, 2008

(65) Prior Publication Data

US 2009/0016131 A1    Jan. 15, 2009

(30) Foreign Application Priority Data

Jul. 10, 2007    (KR) .................. 10-2007-0069101

(51) Int. Cl.
*G11C 7/00*    (2006.01)
(52) U.S. Cl. ...................... 365/203; 365/205
(58) Field of Classification Search .................. 365/203, 365/205, 207
See application file for complete search history.

(56) References Cited

U.S. PATENT DOCUMENTS

| | | | |
|---|---|---|---|
| 6,225,834 B1 * | 5/2001 | Gang | 327/55 |
| 2006/0023534 A1 * | 2/2006 | Do | 365/205 |
| 2007/0070751 A1 * | 3/2007 | Byun | 365/205 |

FOREIGN PATENT DOCUMENTS

| | | |
|---|---|---|
| JP | 11-317072 | 11/1999 |
| KR | 1998-067036 | 10/1998 |
| KR | 1999-0042688 | 6/1999 |

* cited by examiner

*Primary Examiner* — Anh Phung
(74) *Attorney, Agent, or Firm* — F. Chau & Associates, LLC

(57) ABSTRACT

A bit line sense amplifier circuit for use in a semiconductor memory device, and a control method thereof, in which the bit line sense amplifier circuit is controlled to maintain a precharge state thereof until a sense amplifier enable signal to enable the sense amplifier circuit is applied, thereby preventing the bit line sense amplifier circuit of the semiconductor memory device from floating, and preventing or substantially reducing a coupling effect, thereby providing a precise data sensing and amplification operation.

15 Claims, 7 Drawing Sheets

BIT LINE SENSE AMPLIFIER OF SEMICONDUCTOR MEMORY DEVICE AND CONTROL METHOD THEREOF

CROSS REFERENCE TO RELATED APPLICATION

This application claims priority under 35 U.S.C. §119 from Korean Patent Application 10-2007-0069101, filed on Jul. 10, 2007, the contents of which are hereby incorporated by reference in their entirety for all purposes as if fully set forth herein.

BACKGROUND AND SUMMARY

1. Technical Field

The present disclosure relates to semiconductor memory devices and, more particularly, to a bit line sense amplifier circuit for use in a semiconductor memory device and a control method thereof capable of preventing or substantially reducing the sense amplifier circuit from floating, and a coupling effect, with a precise data sensing.

2. Discussion of Background and Summary

Recent rapid development of the semiconductor industry has brought about a large capacity and high performance in semiconductor memory devices. This means a number of elements adapted in the semiconductor memory device provide a large capacity and high performance. In particular, the high performance of a sense amplifier used in the semiconductor memory device is becoming more important.

More specifically, bit line sense amplifiers relating to data sense and amplification require items of relatively higher performance than earlier devices.

The bit line sense amplifier circuit adapted for use in a semiconductor memory device is used for a general operation such as a data read or write operation to a memory cell, and senses and amplifies read or write data and outputs the read or write data to the external or memory cells.

Qualities required in the sense amplifier circuit may be a high-level sensitivity, high-speed operation, wide operating range of power source voltage, low power consumption, small substrate area space and the like. Of these, the sense amplifier circuit needs a more precise data sensing operation based on a high sensitivity, because the semiconductor memory devices are achieving higher performance.

The sense amplifier circuit for the semiconductor memory device has been researched with several solutions to obtain the precise data sensing operation based on high sensitivity. More specifically, when the semiconductor memory device is not under an active state of read or write operation, no power is applied to the sense amplifier circuit such that the sense amplifier circuit becomes in a floating state. Then, the sense amplifier circuit causes several problems, such as erroneous operation. According to the necessity to prevent the floating state in the sense amplifier circuit, a precharge circuit has been introduced.

The precharge circuit is to supply a given level of voltage to the sense amplifier circuit, so that the sense amplifier circuit is not floated when the sense amplifier circuit is not in an active state, that is, when no power is applied thereto. The given level of voltage is called a precharge voltage, and the sense amplifier circuit is indicated as having a precharge state.

A bit line sense amplifier adapted for use within the semiconductor memory device comprises at least one PMOS sense amplifier unit including plural PMOS transistors and at least one NMOS sense amplifier unit including plural NMOS transistors. The PMOS and NMOS sense amplifier units may have a cross-coupled sense amplifier type. Also, the sense amplifier circuit comprises a plurality of NMOS transistors receiving a given level of voltage for precharging.

To execute the active operation, such as a read or write operation in the semiconductor memory device, a sense amplifier enable signal is provided to enable a plurality of sense amplifier units of the sense amplifier circuit. The sense amplifier units perform a sense and amplification operation in response to the sense amplifier enable signal.

On the other hand, when the semiconductor memory device does not perform the active operation, the sense amplifier enable signal of the sense amplifier circuit is disabled. In this case, the precharge signal is enabled. A precharge voltage having a given level of voltage is supplied to the sense amplifier circuit in response to the precharge signal.

As described above, a given level of precharge voltage is applied to the sense amplifier circuit not undergoing the active operation, thus, the sense amplifier circuit is prevented from being in a floating state. At this time, the state of the sense amplifier circuit is called a precharge state.

The sense amplifier circuit is well known to those of ordinary skill in the art, thus, a further detailed description thereof is omitted herein.

FIG. 1 illustrates timings for the operation of a conventional bit line sense amplifier circuit.

As shown in FIG. 1, a time point when a bit line precharge signal BLP generated in a bit line precharge circuit within the bit line sense amplifier circuit is disabled is 't1'. A time point when a sense amplifier precharge signal SAP is disabled in response to the bit line precharge signal BLP is 't2'. A time point when a word line enable signal WL for an active state of the sense amplifier circuit 100 is enabled is 't3'. A time point when a sense amplifier enable signal LAPG/LANG is enabled by the word line enable signal WL is 't4'.

The bit line precharge signal BLP of the bit line precharge circuit in the semiconductor memory device is disabled by an applied active command. The sense amplifier precharge signal SAP is disabled in response to the disabled bit line precharge signal BLP. Then, a word line is enabled in response to the word line enable signal WL. After the word line enable signal WL is enabled and a given time lapses, the sense amplifier enable signal LAPG/LANG is enabled.

At this time, between the point of time when the word line enable signal WL is enabled and the point of time when the sense amplifier enable signal LAPG/LANG is enabled, a voltage appears between bit lines BL/BLB. That is, data of a memory cell is developed through the bit line.

For a time interval between a time point 't2', when the precharge state is completed, and a time point 't4', when the sense amplifier enable signal LAPG/LANG is enabled, the sense amplifier circuit 100 is in the floating state. That is, even though the sense amplifier circuit 100 includes a sense amplifier precharge circuit, it is in the floating state between times 't2' and 't4'.

In the time interval of 't2' to 't4', a voltage is developed and a voltage level between the bit lines BL/BLB is changed. As the voltage development effect occurs between the bit lines BL/BLB, a coupling effect occurs between the drain and source of the PMOS and NMOS transistors within the plurality of sense amplifier units connected with the bit lines BL/BLB. This is why the sense amplifier circuit has a floating state during the time interval between 't2' and 't4'.

The coupling effect increases a potential of the plurality of sense amplifier units and, as a result, interrupts a precise sensing operation of the bit line sense amplifier circuit, causing a drop of sensing level.

Accordingly, exemplary embodiments of the present invention provide a bit line sense amplifier circuit for use in a semiconductor memory device and a control method thereof. The bit line sense amplifier circuit can be prevented from having a floating state. A coupling effect of the bit line sense amplifier circuit can be prevented or substantially reduced, and a precise data sensing of the bit line sense amplifier circuit can be obtained.

According to an exemplary embodiment of the present invention, a bit line sense amplifier circuit for use in a semiconductor memory device is characterized in that the bit line sense amplifier circuit is controlled to maintain a precharge state thereof until a point of time when a sense amplifier enable signal to enable the sense amplifier circuit is applied.

A precharge completion time point of the sense amplifier circuit may occur later by a given time than a precharge completion time point of a bit line connected to the sense amplifier. A sense amplifier precharge signal to control a precharge of the sense amplifier circuit may be a signal generated in the sense amplifier circuit itself, in response to the sense amplifier enable signal. The sense amplifier precharge signal may be an inverted signal of the sense amplifier enable signal. The sense amplifier precharge signal of the sense amplifier circuit may be generated and applied in a specific signal generating circuit adapted to be outside the sense amplifier circuit.

The sense amplifier circuit may comprise a sense amplifier for performing a sensing and amplification operation of data in response to the sense amplifier enable signal, and a sense amplifier controller for controlling a precharge state of the sense amplifier unit in response to a sense amplifier precharge signal.

The sense amplifier may comprise at least one PMOS sense amplifier unit including a plurality of PMOS transistors cross-coupled with one another to amplify data; at least one NMOS sense amplifier unit including a plurality of NMOS transistors cross-coupled with one another to amplify data; and at least one PMOS transistor and at least one NMOS transistor for receiving respective sense amplifier enable signals to enable the sense amplifier units.

The sense amplifier controller may comprise at least one inverter for receiving the sense amplifier enable signal and outputting a sense amplifier precharge signal having an opposed state to the sense amplifier enable signal; and a plurality of NMOS transistors that applies a precharge voltage level to the sense amplifier when the sense amplifier precharge signal is enabled, and that does not apply the precharge voltage level to the sense amplifier when the sense amplifier precharge signal is disabled.

The precharge voltage level of the sense amplifier may be the same as a bit line precharge voltage level. The precharge voltage level may be ½ of the power voltage level.

According to an exemplary embodiment of the present invention, a method of controlling a bit line sense amplifier circuit for use in a semiconductor memory device comprises a first step of enabling a sense amplifier precharge signal and maintaining a precharge state of the sense amplifier circuit; a second step of starting an active operation of the sense amplifier circuit, and applying a sense amplifier enable signal of the sense amplifier circuit to sense a bit line; and a third step of disabling the sense amplifier precharge signal in response to the sense amplifier enable signal.

An applied time point of the sense amplifier precharge signal may be later by a given time than an applied time point of the bit line precharge signal. The sense amplifier precharge signal may be a signal generated in the sense amplifier circuit itself in response to the sense amplifier enable signal. The sense amplifier precharge signal may be an inverted signal of the sense amplifier enable signal. The sense amplifier precharge signal may be generated and applied in a specific signal generating circuit adapted to be outside the sense amplifier circuit.

According to an exemplary embodiment of the present invention, a method of generating a sense amplifier precharge signal to precharge a bit line sense amplifier circuit comprises controlling an enable or disable state of the sense amplifier precharge signal, depending upon a sense amplifier enable signal controlling an operation of the sense amplifier circuit.

The sense amplifier precharge signal may be an inverted signal of the sense amplifier enable signal.

According to exemplary embodiments of the present invention as described above, a bit line sense amplifier circuit for use in a semiconductor memory device can prevent the sense amplifier circuit from becoming in a floating state, and a coupling effect can be prevented or substantially reduced, with precise data sensing and amplification.

BRIEF DESCRIPTION OF THE DRAWINGS

Exemplary embodiments of the present invention will be understood in more detail from the following descriptions taken in conjunction with the accompanying drawings that are given by way of illustration only, and thus are not limitative of the present invention, and wherein.

DETAILED DESCRIPTION OF EXEMPLARY EMBODIMENTS

Exemplary embodiments of the present invention are more fully described below with reference to FIGS. 2 to 6. This invention may, however, be embodied in many different forms and should not be construed as being limited to the exemplary embodiments set forth herein; rather, these exemplary embodiments are provided so that this disclosure is thorough and complete, and conveys the concept of the invention to those of ordinary skill in the art.

Figure 1:
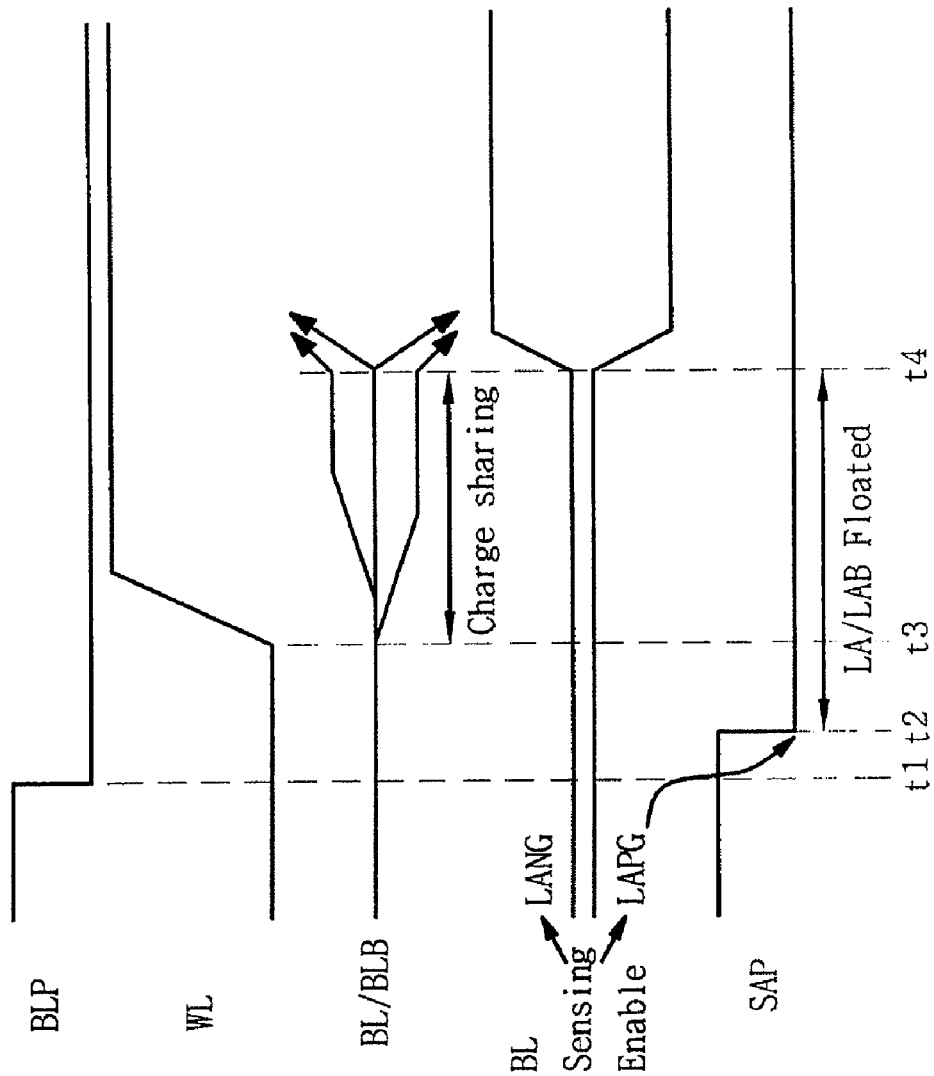
FIG. 1 illustrates timings for operation of a conventional bit line sense amplifier circuit.
Figure 2:
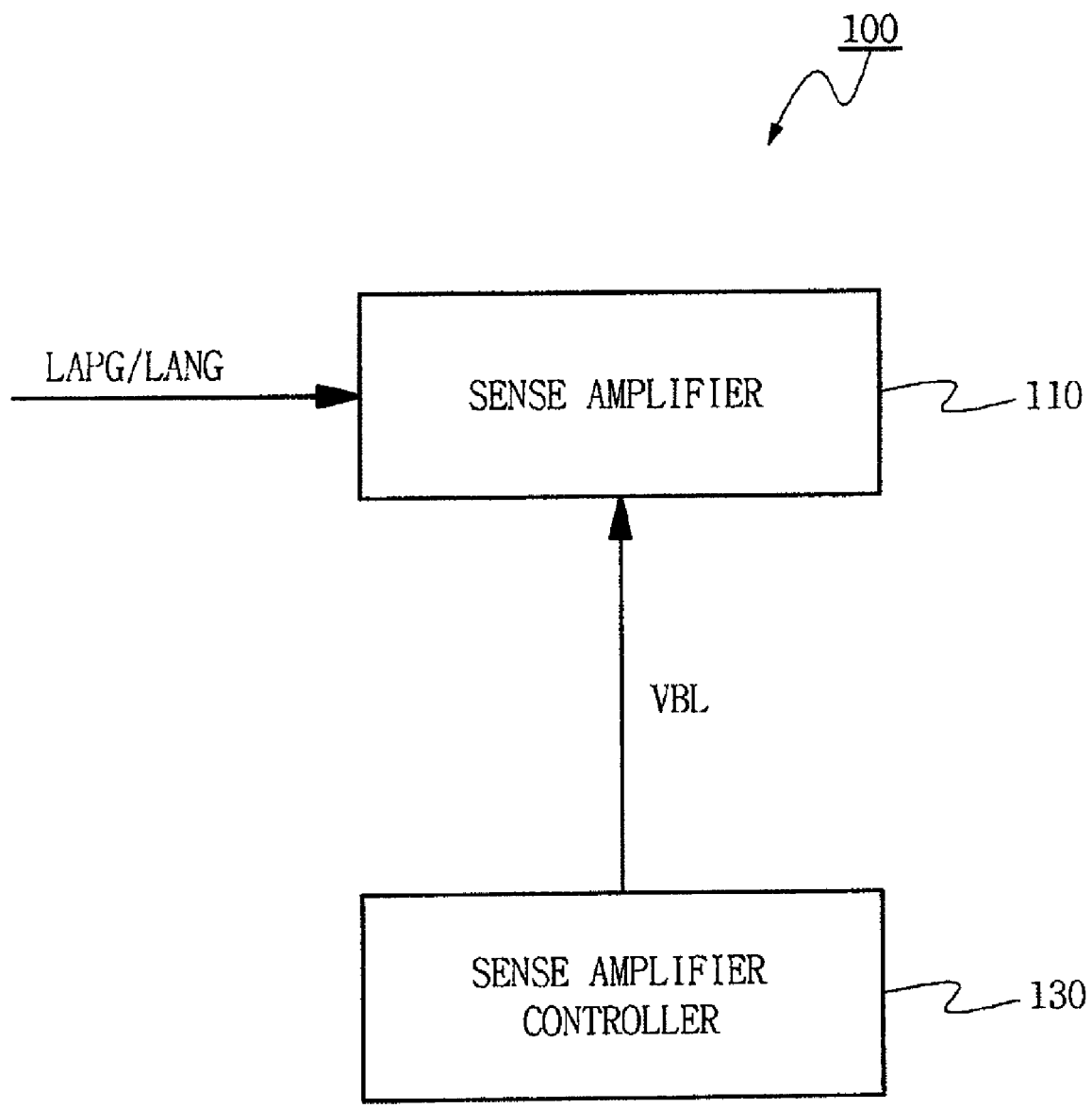
FIG. 2 is a block diagram of a bit line sense amplifier circuit according to an exemplary embodiment of the present invention.

FIG. 2 is a block diagram of a bit line sense amplifier circuit according to an exemplary embodiment of the present invention.

Referring to FIG. 2, a bit line sense amplifier circuit 100 comprises a sense amplifier 110 and a sense amplifier controller 130.

The sense amplifier 110 receives a sense amplifier enable signal LAPG/LANG and operates to perform a sensing and amplification operation of data to be read from or written to a memory cell within the semiconductor memory device when the semiconductor memory device implements a read or write operation. The sense amplifier 110 may not operate in the write operation, but may operate only in the read operation.

The sense amplifier controller 130 supplies a precharge voltage VBL with a given level to the sense amplifier 110 when the sense amplifier 110 has a precharge state.

The sense amplifier circuit is described in more detail with reference to FIG. 3, as follows.

Figure 3:
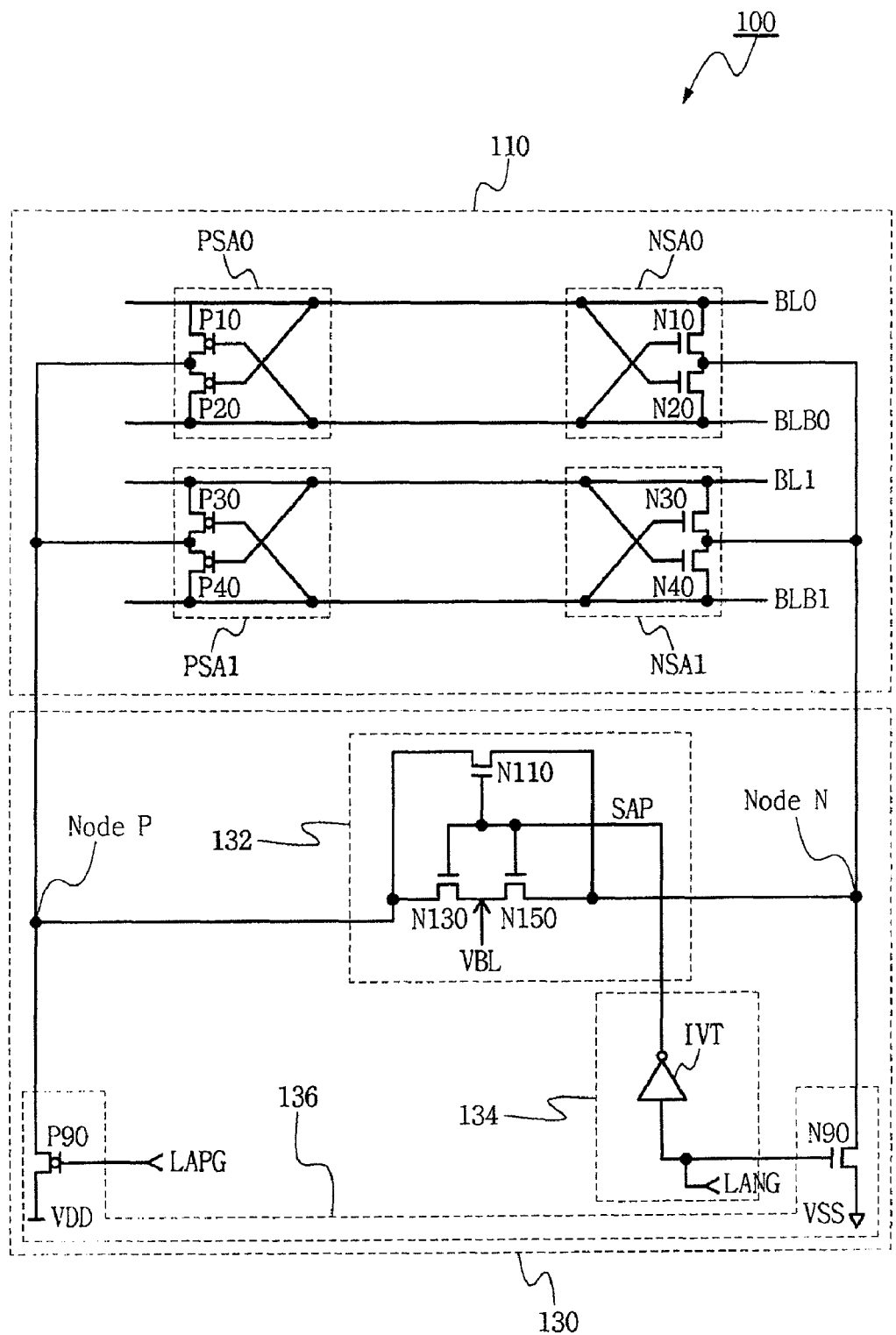
FIG. 3 illustrates in detail an exemplary embodiment of the sense amplifier circuit of FIG. 2.

FIG. 3 illustrates in detail an exemplary embodiment of the sense amplifier circuit of FIG. 2.

As shown in FIG. 3, the bit line sense amplifier circuit 100 comprises the sense amplifier 110 and the sense amplifier controller 130.

The sense amplifier 110 comprises a plurality of PMOS sense amplifier units PSA0 and PSA1 and a plurality of NMOS sense amplifier units NSA0 and NSA1 connected between respective bit lines BL/BLB.

The PMOS sense amplifier unit PSA0 is constructed by connecting in series a plurality of PMOS transistors P10 and P20, in which the first PMOS transistor P10 is connected to a main bit line BL0 and the second PMOS transistor P20 is connected to a sub bit line BLB0.

The NMOS sense amplifier unit NSA0 is constructed by connecting in series a plurality of NMOS transistors N10 and N20, in which the first NMOS transistor N10 is connected to the main bit line BL0 and the second NMOS transistor N20 is connected to the sub bit line BLB0.

The PMOS and NMOS sense amplifier units PSA0 and NSA0 adapted within the sense amplifier 110 have a cross-coupled connection. That is, the sense amplifier circuit may be a cross-coupled type. Unlike that, the sense amplifier circuit may be a sense amplifier circuit, such as a current mirror type or differential amplifier type and the like, well-known to those of ordinary skill in the art.

As shown in FIG. 3, the sense amplifier controller 130 comprises a precharge circuit 132, a precharge signal generating circuit 134, and a power source circuit 136.

The precharge circuit 132 comprises a plurality of NMOS transistors N110, N130 and N150 receiving a precharge signal SAP through commonly connected gates.

The first NMOS transistor N130 is connected between the PMOS sense amplifier unit PSA0 and a precharge voltage applying terminal, and supplies the precharge voltage VBL to the PMOS sense amplifier unit PSA0.

The second NMOS transistor N150 is connected between the precharge voltage applying terminal and the NMOS sense amplifier unit NSA0, and supplies the precharge voltage VBL to the NMOS sense amplifier unit NSA0.

The third NMOS transistor N110 is connected between the PMOS sense amplifier unit PSA0 and the NMOS sense amplifier unit NSA0, and equalizes the potentials on the precharge voltage applying terminals of the two sense amplifier units PSA0 and NSA0.

The precharge signal generating circuit 134 comprises at least one inverter IVT. The precharge signal generating circuit 134 may have various constructions depending on the configuration of the precharge circuit 132. For example, when the precharge circuit 132 is comprised of a plurality of PMOS transistors, the precharge signal generating circuit 134 may comprise at least one buffer.

The power source circuit 136 comprises at least one PMOS transistor P90 connecting the plurality of PMOS sense amplifier units PSA0 and PSA1 to a power terminal VDD, and at least one NMOS transistor N90 connecting the plurality of NMOS sense amplifier units NSA0 and NSA1 to a ground power terminal VSS.

Operation of the bit line sense amplifier circuit 100 is described as follows.

In this exemplary embodiment, a data line (not shown) is coupled to the bit line BL0 through a column selection signal.

Then, a voltage corresponding to a voltage level of data of the bit line is applied to the data line. Assuming that in the bit lines BL0/BLB0, the main bit line BL0 has a voltage of a low level and the sub bit line BLB0 has a voltage of a high level; the second PMOS transistor P20 of the PMOS sense amplifier unit PSA0 is turned on by the low level voltage of the main bit line BL0, and the low level voltage is output through the PMOS sense amplifier unit PSA0. At this time, when the PMOS transistor P90 connected to the power source terminal VDD receives a sense amplifier enable signal LAPG having a low level, the PMOS transistor P90 is turned on, and the power source terminal VDD is coupled to the second PMOS transistor P20. Then, the low level voltage output through the second PMOS transistor P20 is coupled with the power source terminal VDD, and is amplified to a level of the power source voltage.

Because the sub bit line BLB0 has a high level voltage, the first NMOS transistor N10 is turned on, and outputs the high-level voltage. At this time, when the NMOS transistor N90 coupled to the ground voltage terminal VSS receives a sense amplifier enable signal LANG having a high level, the NMOS transistor N90 is turned on and the ground voltage terminal VSS is coupled to the first NMOS transistor N10. Thus, the high level voltage output through the first NMOS transistor N10 is coupled to the ground power terminal VSS, and is dropped to a voltage of the ground voltage level.

In bit lines BL0/BLB0 and BL1/BLB1 coupled with the column selection signal, the data sensing and amplification operation is performed similarly to the above description by the column selection signal, thus a further detailed description is omitted.

As described above, in an active mode of performing a sensing and amplification operation of data, the sense amplifier 110 receives the sense amplifier enable signal LAPG/LANG from the outside, and performs the data sensing and amplification operation. Meanwhile, in a precharge mode not the active mode, the sense amplifier 110 does not receive the power source voltage level or the ground power level, but receives a precharge voltage level VBL supplied through the sense amplifier controller 130.

When the sense amplifier enable signal LANG is applied to the NMOS transistor N90 that serves as a switching between the NMOS sense amplifier units NSA0 and NSA1 of the sense amplifier 110 and the ground voltage terminal VSS, the sense amplifier enable signal LANG is also applied to the precharge signal generating circuit 134. The precharge signal generating circuit 134 inverts the sense amplifier enable signal LANG and outputs a sense amplifier precharge signal SAP in response to the applied sense amplifier enable signal LANG. In this exemplary embodiment, the sense amplifier precharge signal SAP may be a signal output through a plurality of buffers when the precharge circuit 132 includes plural PMOS transistors or receives the sense amplifier enable signal LAPG applied to the PMOS transistor P90 to generate the sense amplifier precharge signal SAP.

The sense amplifier precharge signal SAP generated through the precharge signal generating circuit 134 is applied to operate the precharge circuit 132.

The plurality of NMOS transistors N110, N130, and N150 are turned on, to supply the precharge voltage VBL supplied to the plurality of NMOS transistors N110, N130 and N150 to the sense amplifier 110, in response to the sense amplifier precharge signal SAP. For example, when the sense amplifier precharge signal SAP has a high level voltage, the third NMOS transistor N110, the first NMOS transistor N130 and the second NMOS transistor N150 are each turned on. The third NMOS transistor N110 serves to equalize the potentials on the precharge voltage applying terminals of the plural PMOS sense amplifier units PSA0 and the plural NMOS sense amplifier units NSA0 of the sense amplifier 110 to the same voltage level. Also, the first NMOS transistor N130 and the second NMOS transistor N150 are each turned on in response to the sense amplifier precharge signal SAP. Thus, the precharge voltage level VBL supplied through the first NMOS transistor N130 and the second NMOS transistor N150 is supplied to first PMOS sense amplifier unit PSA0 and first NMOS sense amplifier unit NSA0 connected to selected-bit lines BL0/BLB0. As a result, the sense amplifier 110 does not become floating, even in a state that is not an active mode. In this exemplary embodiment, the precharge voltage level VBL may be ½ the voltage level of the power source voltage level.

The state of respective signals of the bit line sense amplifier circuit is described as follows.

Figure 4:
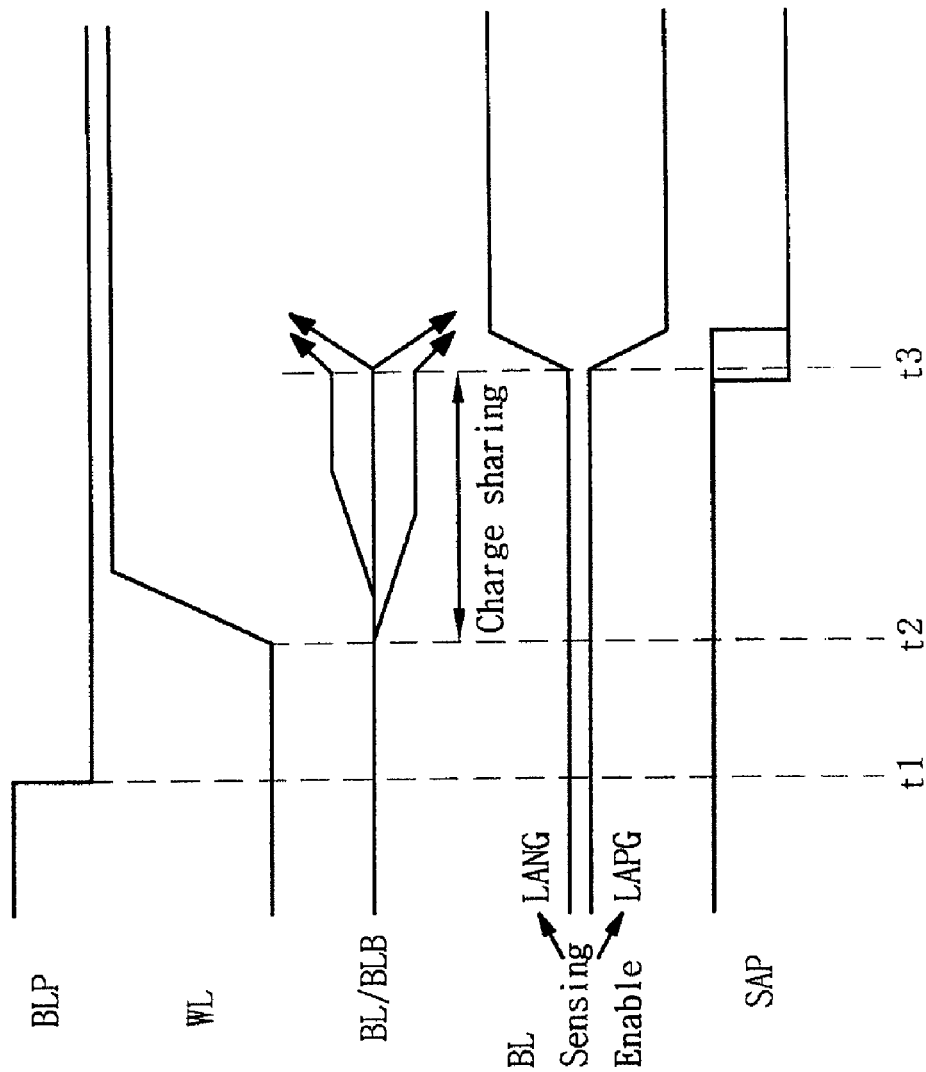
FIG. 4 illustrates timings of operation per signal in the circuit of FIG. 3.

FIG. 4 illustrates timings of operation per signal in the sense amplifier circuit 100 of FIG. 3.

As shown in FIG. 4, a time when a bit line precharge signal BLP is disabled is t1. A time when a word line WL is enabled in response to a disabled bit line precharge signal BLP is t2. The sense amplifier enable signal LANG/LAPG is enabled in response to the enabled word line WL. A time simultaneous to that when the sense amplifier precharge signal SAP is disabled in response to the enabled sense amplifier enable signal LANG/LAPG is t3.

As the bit line precharge signal BLP is disabled, from the time t1 the bit line precharge circuit connected between the bit lines BL0/BLB0 is disabled, and a precharge state of the bit lines BL0/BLB0 is completed. That is, the precharge voltage level VBL is not supplied any more to the bit lines BL0/BLB0. Then, the active mode starts and the word line WL is enabled. After the word line WL is enabled, data of the memory cell is developed to the bit lines BL0/BLB0. Then, when the sense amplifier enable signal LANG/LAPG is enabled, the power source voltage level is supplied to the bit line sense amplifier circuit 100, and so the sense amplifier 110 operates and performs a sensing and amplification operation. On the other hand, the sense amplifier precharge signal SAP is disabled in response to the sense amplifier enable signal LAPG/LANG in the sense amplifier controller 130. Then the supply of the precharge voltage level VBL to the sense amplifier circuit is completed.

At this time, as described above with reference to FIG. 3, the sense amplifier enable signal LANG/LAPG is received and inverted, thus the sense amplifier precharge signal SAP and the sense amplifier enable signal LANG applied to the NMOS transistor N90 have mutually opposite logic states.

When the sense amplifier enable signal LAPG applied to the PMOS transistor P90 is received, however, the sense amplifier enable signal LAPG and the sense amplifier precharge signal SAP have the same state, as shown in FIG. 4.

In a conventional case, as the sense amplifier precharge signal SAP is disabled in response to the bit line precharge signal BLP, the bit line sense amplifier circuit 100 has a floating state until the sense amplifier enable signal LANG/LAPG is enabled.

According to exemplary embodiments of the present invention, the sense amplifier precharge signal SAP is disabled in response to the sense amplifier enable signal LANG/LAPG and does not respond to the bit line precharge signal BLP. Accordingly, in the bit line sense amplifier circuit 100, the floating state that a supply of a voltage level is finished does not occur, even while changing the precharge mode to the active mode.

Therefore, an error operation and the like of the bit line sense amplifier circuit 100 caused by the floating state of the bit line sense amplifier circuit 100 can be prevented, thereby increasing a sensitivity of the bit line sense amplifier circuit 100.

The sense amplifier precharge signal SAP increasing the sensitivity of the bit line sense amplifier circuit 100 may be generated in a sense amplifier precharge signal generating circuit (not shown) adapted specifically, instead of being generated within the bit line sense amplifier circuit 100 itself.

Figure 5:
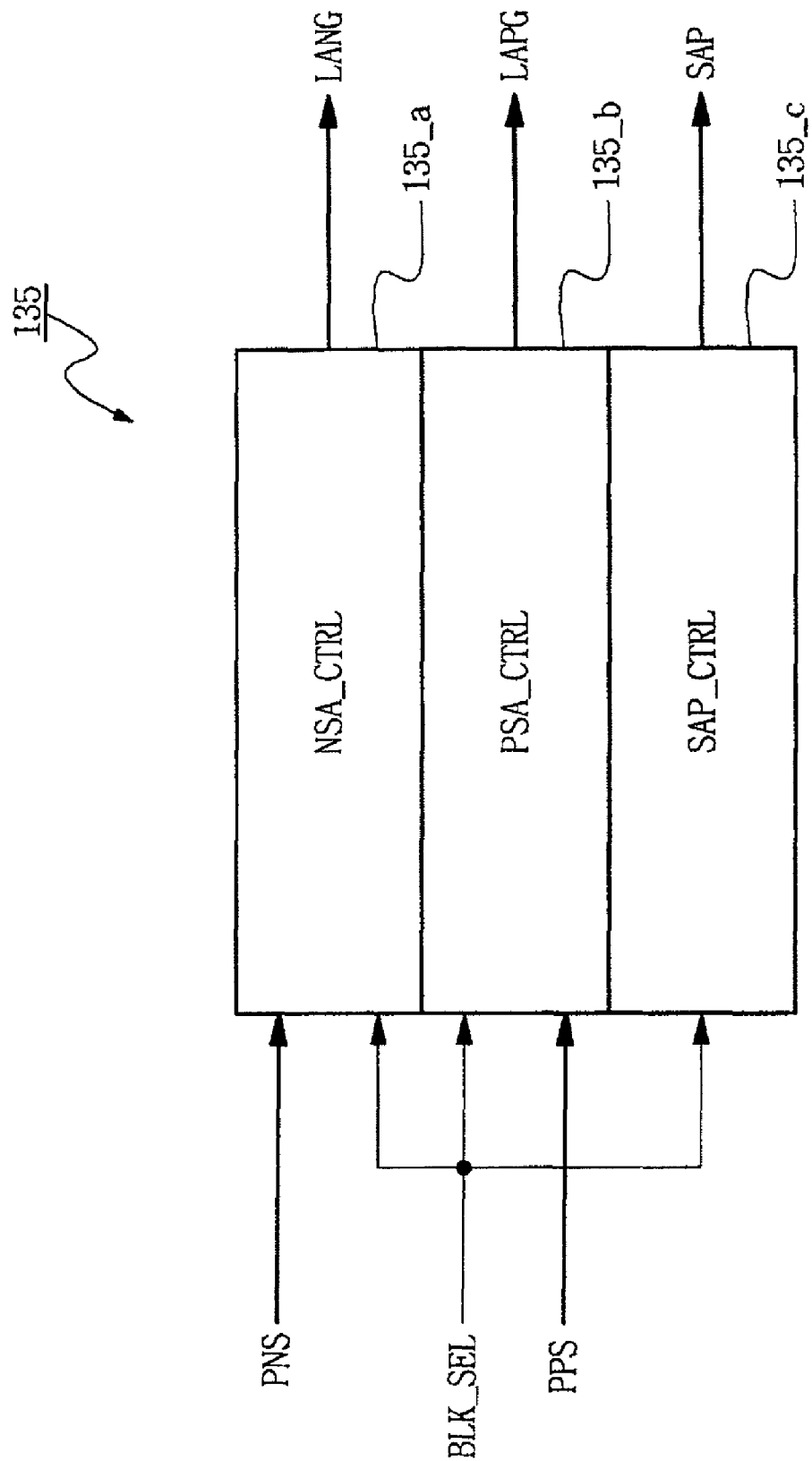
FIG. 5 is a block diagram of sense amplifier precharge signal generating circuit according to an exemplary embodiment of the present invention.

FIG. 5 is a block diagram of a sense amplifier precharge signal generating circuit 135 according to an exemplary embodiment of the present invention.

As shown in FIG. 5, the sense amplifier precharge signal generating circuit 135 comprises an NMOS sense amplifier unit controller 135_a, a PMOS sense amplifier unit controller 135_b, and a sense amplifier precharge controller 135_c.

The NMOS sense amplifier unit controller 135_a receives a block selection signal BLK_SEL and a first enable signal PNS from the external to enable the NMOS sense amplifier unit controller 135_a, and outputs the NMOS sense amplifier enable signal LANG in response to the received signals.

The PMOS sense amplifier unit controller 135_b receives the block selection signal BLK_SEL and a second enable signal PPS from the external to enable the PMOS sense amplifier unit controller 135_b, and outputs PMOS sense amplifier enable signal LAPG in response to the received signals.

The sense amplifier precharge controller 135_c outputs the sense amplifier precharge signal SAP in response to the block selection signal BLK_SEL.

The NMOS sense amplifier unit controller 135_a, the PMOS sense amplifier unit controller 135_b, and the sense amplifier precharge controller 135_c may be configured diversely by those of ordinary skill in the art, thus a detailed description therefor is omitted.

A potential difference between the sense amplifier units according to an exemplary embodiment of the invention is described in detail, as follows.

A general bit line sense amplifier includes a PMOS sense amplifier unit, an NMOS sense amplifier unit, and a precharging circuit.

Figure 6A:
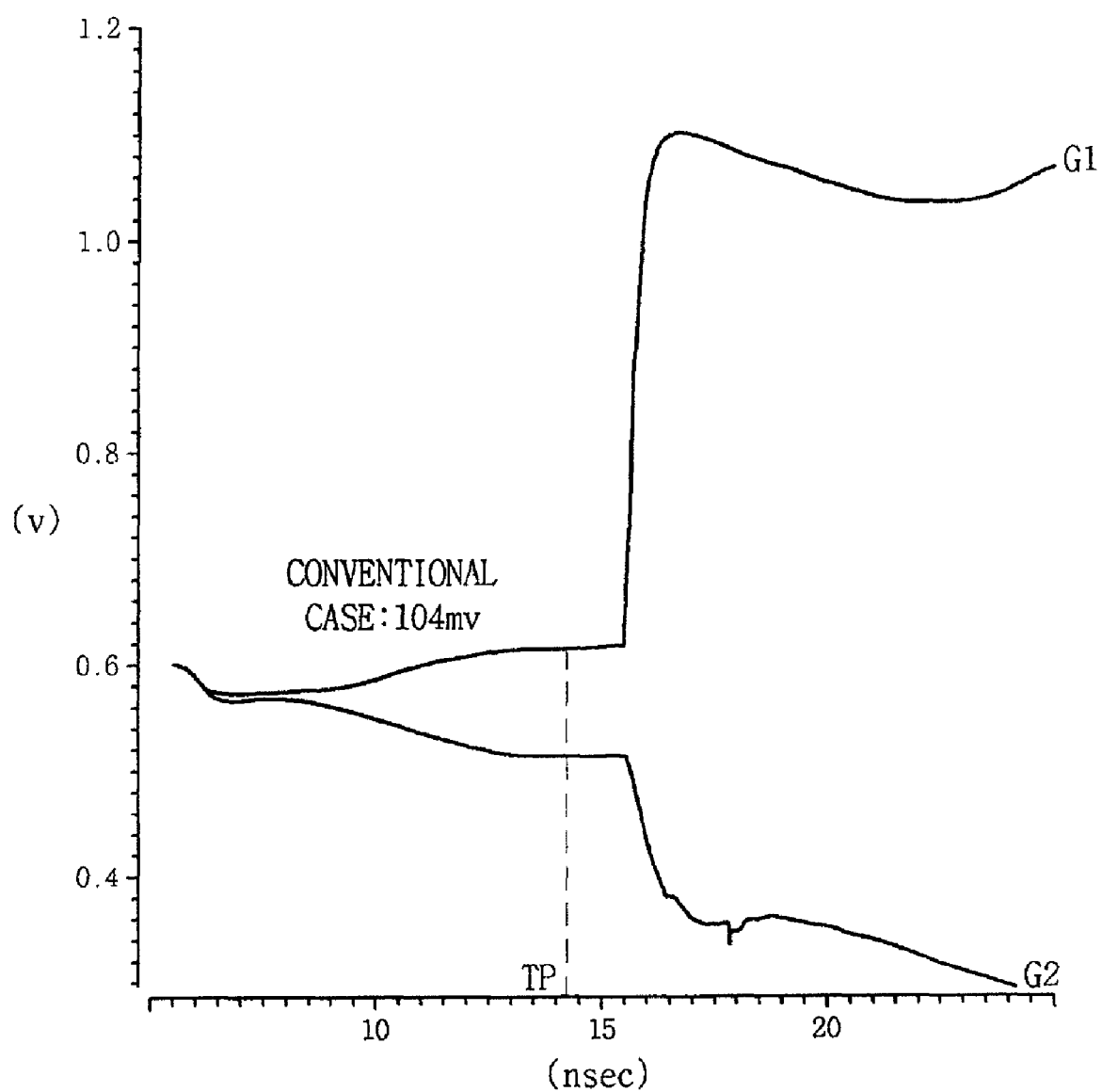
FIGS. 6A and 6B are graphs illustrating a potential difference between sense amplifier units according to an exemplary embodiment of the present invention.
Figure 6B:
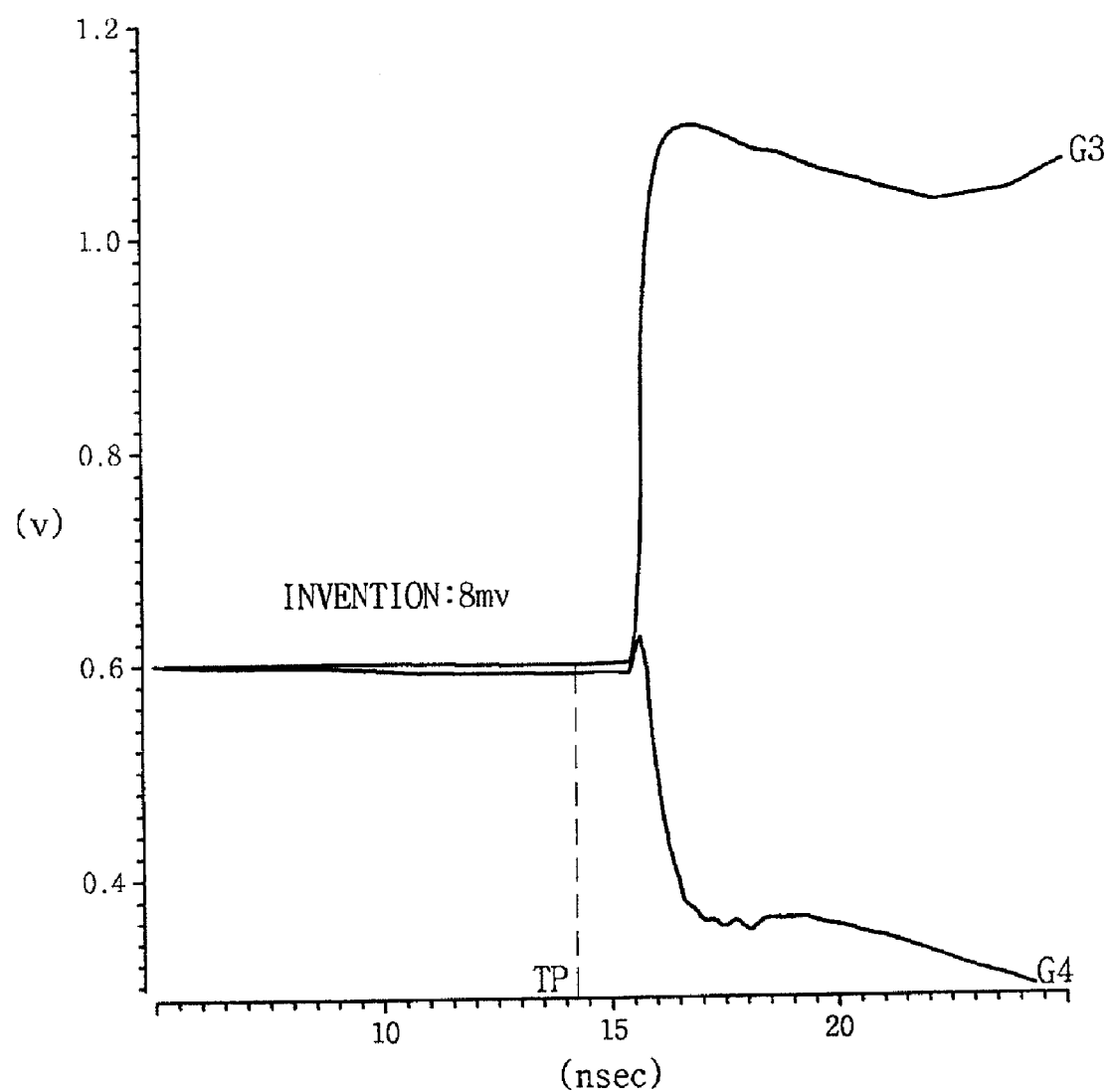

FIG. 6A is a graph illustrating a potential difference between two nodes of the general bit line sense amplifier circuit when the general bit line sense amplifier is in a precharged state, and FIG. 6B is a graph illustrating a potential difference between a node P and a node N shown in FIG. 3 according to an exemplary embodiment of the invention.

In FIGS. 6A and 6B, the ordinate axis represents a potential (V) and the abscissa axis represents time (nsec).

In FIG. 6A, a first trace G1 indicates a change in the potential on a contact point where the PMOS sense amplifier unit and the precharging unit meet, and a second trace G2 indicates a change in the potential on a contact point where the NMOS sense amplifier unit and the precharge unit meet in the conventional bit line sense amplifier circuit. In FIG. 6B, a trace G3 indicates a change in the potential on the node P shown in FIG. 3 where the PMOS sense amplifier unit PSA0 and the precharge circuit meet, and a trace G4 indicates a change in the potential on the node N where the NMOS sense amplifier unit NSA0 and the precharge circuit meet.

At a time point TP in FIGS. 6A and 6B, the potential difference of 104 mV is in the conventional case, but in an exemplary embodiment of the invention, the potential difference between the PMOS sense amplifier unit PSA0 and the NMOS sense amplifier unit NSA0 is generated as 8 mV. That is, as compared with the conventional sense amplifier circuit, in the exemplary embodiment of the present invention, the potential difference between the PMOS sense amplifier unit PSA0 and the NMOS sense amplifier unit NSA0 is hardly generated. Thus, a more precise data sensing of the bit line sense amplifier units can be obtained.

Consequently, in the bit line sense amplifier 100, the sense amplifier precharge signal SAP is disabled in response to the sense amplifier enable signal LANG/LAPG. That is, when the bit line sense amplifier circuit 100 is changed from a precharge mode to an active mode, the bit line sense amplifier circuit 100 can be prevented from floating. Moreover, the sense amplifier precharge signal SAP is generated by inverting the sense amplifier enable signal LANG/LAPG, thus it does not need to receive a sense amplifier precharge signal SAP specifically from the outside.

In addition, a coupling effect caused according to a floating state of the bit line sense amplifier circuit 100 can be prevented, and thus the situation can be prevented in which a voltage level of the bit line sense amplifier circuit 100 is coupled-up or down according to a voltage level of the data loaded on the bit line BL0/BLB0 and a sensing error occurs.

As described above, according to exemplary embodiments of the present invention, a bit line sense amplifier circuit for use in a semiconductor memory device can prevent a sense amplifier circuit from floating and can prevent or substantially reduce a coupling effect, thereby obtaining a precise data sensing and amplification operation.

It will be apparent to those of ordinary skill in the art that modifications and variations can be made in the present invention without deviating from the spirit or scope thereof. Thus, it is intended that the present invention cover any such modifications and variations and that these and other changes and modifications are seen to be within the true spirit and scope of the present invention as defined by the appended claims.

In the drawings and specification, there have been disclosed exemplary embodiments of the present invention and, although specific terms are employed, they are used in a generic and descriptive sense only and not for purposes of limitation, the scope of the invention being set forth in the following claims.

What is claimed is:

1. A bit line sense amplifier circuit for use in a semiconductor memory device, wherein the bit line sense amplifier circuit is controlled to maintain a precharge state thereof until a time when a sense amplifier enable signal to enable the bit line sense amplifier circuit is applied thereto,
wherein the bit line sense amplifier circuit comprises:
a sense amplifier for performing a sensing and amplification operation of data in response to the sense amplifier enable signal; and
a sense amplifier controller for controlling a precharge state of the sense amplifier in response to a sense amplifier precharge signal, and
wherein the sense amplifier comprises:
a PMOS sense amplifier unit including a plurality of PMOS transistors cross-coupled with one another to amplify data;
an NMOS sense amplifier unit including a plurality of NMOS transistors cross-coupled with one another to amplify data; and
a PMOS transistor and an NMOS transistor for receiving respective sense amplifier enable signals to enable the respective PMOS and NMOS sense amplifier units.

2. The circuit of claim 1, wherein a precharge completion time of the sense amplifier circuit is later by a given time than a precharge completion time of a bit line connected to the bit line sense amplifier circuit.

3. The circuit of claim 2, wherein the sense amplifier precharge signal controlling a precharge of the bit line sense amplifier circuit is generated in the sense amplifier circuit in response to the sense amplifier enable signal.

4. The circuit of claim 3, wherein the sense amplifier precharge signal is an inverted signal of the sense amplifier enable signal.

5. The circuit of claim 2, wherein the sense amplifier precharge signal of the bit line sense amplifier circuit is generated and applied in a signal generating circuit adapted to be outside of the sense amplifier circuit.

6. The circuit of claim 1, wherein the sense amplifier controller comprises:
an inverter for receiving the sense amplifier enable signal and outputting a sense amplifier precharge signal having a state opposite to a state of the sense amplifier enable signal; and
a plurality of NMOS transistors for applying a precharge voltage level to the sense amplifier when the sense amplifier precharge signal is enabled, and for preventing applying the precharge voltage level to the sense amplifier when the sense amplifier precharge signal is disabled.

7. The circuit of claim 6, wherein the precharge voltage level of the sense amplifier is the same as a bit line precharge voltage level.

8. The circuit of claim 7, wherein the precharge voltage level is ½ of a power voltage level.

9. A method of controlling a bit line sense amplifier circuit used in a semiconductor memory device, the method comprising:
enabling a sense amplifier precharge signal and maintaining a precharge state of the sense amplifier circuit;
starting an active operation of the sense amplifier circuit, and applying a sense amplifier enable signal of the sense amplifier circuit to sense a state of a bit line; and
disabling the sense amplifier precharge signal in response to the sense amplifier enable signal,
wherein the bit line sense amplifier circuit comprises:
a sense amplifier for performing a sensing and amplification operation of data in response to the sense amplifier enable signal; and
a sense amplifier controller for controlling the precharge state of the sense amplifier in response to the sense amplifier precharge signal, and
wherein the sense amplifier comprises:
a PMOS sense amplifier unit including a plurality of PMOS transistors cross-coupled with one another to amplify data;
an NMOS sense amplifier unit including a plurality of NMOS transistors cross-coupled with one another to amplify data; and
a PMOS transistor and an NMOS transistor for receiving respective sense amplifier enable signals to enable the respective PMOS and NMOS sense amplifier units.

10. The method of claim 9, wherein an applied time of the sense amplifier precharge signal is later by a given time than an applied time of a bit line precharge signal.

11. The method of claim 10, wherein the sense amplifier precharge signal is generated in the sense amplifier circuit in response to the sense amplifier enable signal.

12. The method of claim 11, wherein the sense amplifier precharge signal is an inverted signal of the sense amplifier enable signal.

13. The method of claim 10, wherein the sense amplifier precharge signal is generated and applied in a signal generating circuit adapted to be outside of the sense amplifier circuit.

14. A method of generating a sense amplifier precharge signal to precharge a bit line sense amplifier circuit, the method comprising:

controlling an enable or disable state of the sense amplifier precharge signal, depending upon a sense amplifier enable signal controlling an operation of the sense amplifier circuit, wherein the bit line sense amplifier circuit comprises:

a sense amplifier for performing a sensing and amplification operation of data in response to the sense amplifier enable signal; and a sense amplifier controller for controlling the precharge state of the sense amplifier in response to the sense amplifier precharge signal, and wherein the sense amplifier comprises:

a PMOS sense amplifier unit including a plurality of PMOS transistors cross-coupled with one another to amplify data;

an NMOS sense amplifier unit including a plurality of NMOS transistors cross-coupled with one another to amplify data; and a PMOS transistor and an NMOS transistor for receiving respective sense amplifier enable signals to enable the respective PMOS and NMOS sense amplifier units.

15. The method of claim 14, wherein the sense amplifier precharge signal is an inverted signal of the sense amplifier enable signal.

* * * * *